United States Patent
Chidambarrao et al.

(10) Patent No.: US 7,306,983 B2
(45) Date of Patent: Dec. 11, 2007

(54) METHOD FOR FORMING DUAL ETCH STOP LINER AND PROTECTIVE LAYER IN A SEMICONDUCTOR DEVICE

(75) Inventors: Dureseti Chidambarrao, Weston, CT (US); Ying Li, Newburgh, NY (US); Rajeev Malik, Pleasantville, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 10/905,024

(22) Filed: Dec. 10, 2004

(65) Prior Publication Data

US 2006/0128086 A1    Jun. 15, 2006

(51) Int. Cl.
*H01L 21/8238* (2006.01)

(52) U.S. Cl. ............ 438/199; 438/230; 438/581; 438/583; 438/791; 438/FOR. 431; 257/E21.292; 257/E21.293

(58) Field of Classification Search ............ 438/199, 438/230, 581, 583, 791, 902, 958, 970, 976, 438/FOR. 431; 257/640, E21.292, E21.293
See application file for complete search history.

(56) References Cited

U.S. PATENT DOCUMENTS

| | | | | |
|---|---|---|---|---|
| 5,258,333 | A * | 11/1993 | Shappir et al. | 438/762 |
| 5,362,526 | A * | 11/1994 | Wang et al. | 427/573 |
| 6,939,814 | B2 * | 9/2005 | Chan et al. | 438/778 |
| 7,052,946 | B2 * | 5/2006 | Chen et al. | 438/199 |
| 2004/0126990 | A1 * | 7/2004 | Ohta | 438/435 |
| 2004/0180536 | A1 * | 9/2004 | Fujiwara et al. | 438/633 |
| 2005/0260810 | A1 * | 11/2005 | Cheng et al. | 438/199 |
| 2006/0079046 | A1 * | 4/2006 | Yang et al. | 438/199 |
| 2006/0113568 | A1 * | 6/2006 | Chan et al. | 257/204 |

* cited by examiner

*Primary Examiner*—George Fourson
*Assistant Examiner*—Thanh Van Pham
(74) *Attorney, Agent, or Firm*—Ira D. Blecker; Hoffman, Warnick & D'Alessandro LLC

(57) ABSTRACT

The present invention provides a semiconductor device having dual nitride liners, a silicide layer, and a protective layer beneath one of the nitride liners for preventing the etching of the silicide layer. A first aspect of the invention provides a method for use in the manufacture of a semiconductor device comprising the steps of applying a protective layer to a device, applying a first silicon nitride liner to the device, removing a portion of the first silicon nitride liner, removing a portion of the protective layer, and applying a second silicon nitride liner to the device.

22 Claims, 5 Drawing Sheets

METHOD FOR FORMING DUAL ETCH STOP LINER AND PROTECTIVE LAYER IN A SEMICONDUCTOR DEVICE

BACKGROUND OF THE INVENTION

(1) Technical Field

The present invention relates generally to semiconductor devices and more particularly to a device including an NFET/PFET having dual etch stop liners and a protective layer for preventing the etching of an underlying silicide layer during removal of a portion of an etch stop liner.

(2) Related Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents).

One way to apply such stresses to a FET is the use of intrinsically-stressed barrier silicon nitride liners. For example, a tensile-stressed silicon nitride liner may be used to cause tension in an NFET channel while a compressively-stressed silicon nitride liner may be used to cause compression in a PFET channel. Accordingly, a dual/hybrid liner scheme is necessary to induce the desired stresses in an adjacent NFET and PFET.

In the formation of a dual/hybrid barrier nitride liner for stress enhancement of NFET/PFET devices, the first deposited liner must be removed in one of the two FET regions by patterning and etching. In order to ensure sufficient contact of a second deposited liner, it is preferable that the first liner be completely removed from the FET region. However, complete removal of the first liner requires an overetch, necessarily resulting in some etching of the underlying silicide. Etching of the silicide, in turn, results in an increase in silicide resistance ($R_s$).

FIG. 1 shows a device 100 typical of the prior art, comprising a buried silicon dioxide (BOX) 110, a shallow trench isolation (STI) 120, an n-channel field effect transistor (NFET) 140, a spacer 142, a p-channel field effect transistor (PFET) 150, a spacer 152, a tensile silicon nitride liner 170 adjacent NFET 140, a compressive silicon nitride liner 180 adjacent PFET 150, an intact silicide layer 130a, 130b, and an etched silicide layer 132a, 132b. As can be seen in FIG. 1, during the manufacture of device 100, the etching of tensile silicon nitride liner 170 from an area adjacent PFET 150 has resulted in etched silicide layer 132a, 132b being thinner than silicide layer 130a, 130b adjacent NFET 140. As noted above, etched silicide layer 132a, 132b has an increased $R_s$ relative to silicide layer 130a, 130b.

Silicide layer 130a, 130b normally has a thickness between about 15 nm and about 50 nm, with a corresponding $R_s$ between about 6 ohm/sq and about 20 ohm/sq. By comparison, etched silicide layer 132a, 132b could have a thickness between about 5 nm and about 40 nm, with a corresponding $R_s$ between about 12 ohm/sq and about 40 ohm/sq.

For technologies beyond 90 nm, which utilize sub-50 nm gate lengths and less than 100 nm diffusion widths, increases in $R_s$ are unacceptable for at least two reasons. First, the increases in $R_s$ will impact performance of the device. Second, erosion of the silicide layer increases the chance of failure by causing polysilicon conductor (PC) discontinuities in critical circuits.

Accordingly, a need exists for a semiconductor device having dual etch stop liners and an unetched silicide layer and methods for the manufacture of such a device.

SUMMARY OF THE INVENTION

The present invention provides a semiconductor device having dual nitride liners, a silicide layer, and a protective layer beneath one of the nitride liners for preventing the etching of the silicide layer. A first aspect of the invention provides a method for use in the manufacture of a semiconductor device comprising the steps of applying a protective layer to a device, applying a first silicon nitride liner to the device, removing a portion of the first silicon nitride liner, removing a portion of the protective layer, and applying a second silicon nitride liner to the device.

A second aspect of the invention provides a method for use in the manufacture of a semiconductor device having an NFET and a PFET, comprising the steps of applying a protective layer to the NFET, PFET, and a silicide layer adjacent at least one of the NFET and the PFET, applying a first silicon nitride liner to a portion of the protective layer adjacent the NFET, PFET, and the silicide layer, removing a portion of the first silicon nitride liner from the protective layer adjacent one of the NFET and the PFET, removing a portion of the protective layer from an area adjacent the one of the NFET and the PFET, and applying a second silicon nitride liner to the first silicon nitride liner and the area from which the protective layer was removed.

A third aspect of the invention provides a semiconductor device comprising a protective layer adjacent a first device, a first silicon nitride liner over the protective layer, a second silicon nitride liner adjacent a second device, and a first silicide layer adjacent the first device and a second silicide layer adjacent the second device, wherein a thickness is substantially the same in the first and second silicide layers.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 2:
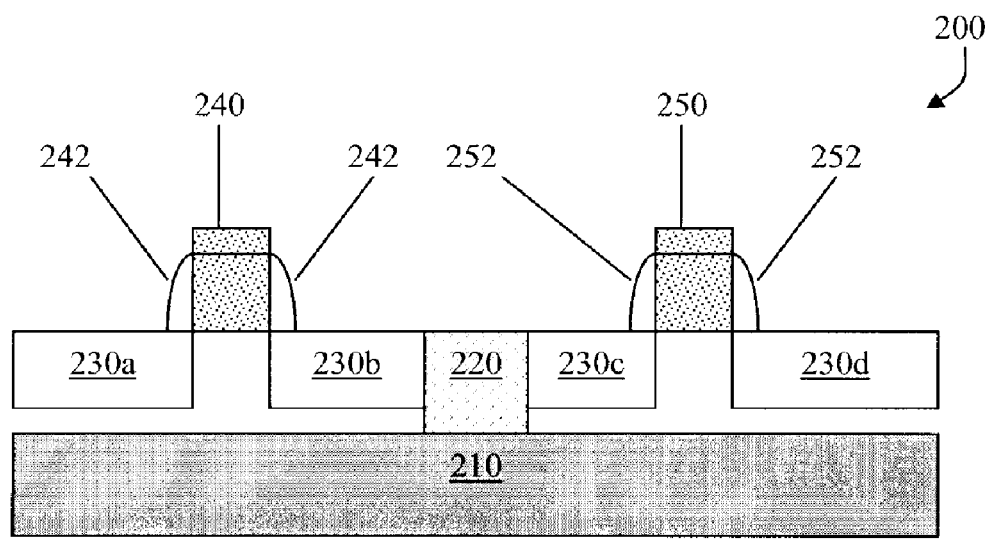
FIG. 2 shows a device including an NFET/PFET.

Referring to FIG. 2, a device 200 is shown comprising a buried silicon dioxide (BOX) 210, a shallow trench isolation (STI) 220, an n-channel field effect transistor (NFET) 240, a spacer 242, a p-channel field effect transistor (PFET) 250, a spacer 252, and a silicide layer 230a-d. Silicide layer 230a-d may be any material known in the art, including, for example, cobalt silicide ($CoSi_2$), titanium silicide ($TiSi_2$), molybdenum sillicide ($MoSi_2$), tungsten silicide ($WSi_2$), nickel silicide ($Ni_xSi_y$), tantalum silicide ($TaSi_2$), etc.

Figure 3:
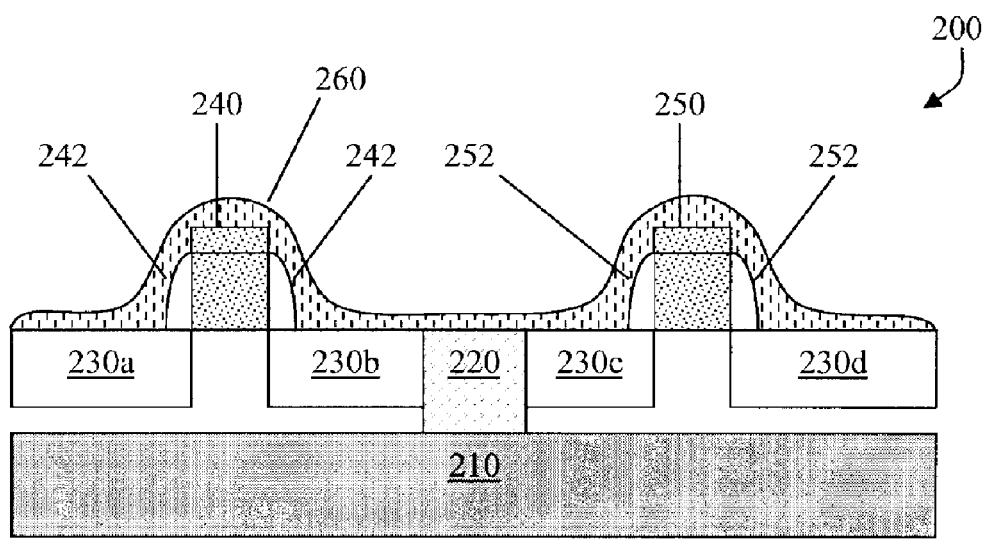
FIG. 3 shows the deposition of a low temperature oxide layer to the device of FIG. 2.

In FIG. 3, protective layer 260 is deposited onto a surface of device 200. In one embodiment, protective layer 260 includes a low temperature oxide (LTO). The LTO may be, for example, silicon dioxide. Typically, protective layer 260 would be deposited at a temperature below 500° C. A suitable deposition methods includes, for example, chemical vapor deposition (CVD). Protective layer 260 provides protection for silicide layer 230a-d during subsequent etching of later-deposited silicon nitride liners. However, deposition of protective layer 260, or any other material, may reduce the stress transfer from a later-deposited silicon nitride liner. This reduction in stress transfer is attributable, in part, to the thickness of protective layer 260. Accordingly, it is preferred that protective layer 260 be thin. Most preferably, protective layer 260 has a thickness of about 5 nm or less. Alternatively, a silicon oxynitride may be used instead of LTO for protective layer 260. A layer of silicon oxynitride will generally allow greater stress transfer than an LTO of the same thickness. Suitable silicon oxynitrides can be generated by oxide nitridation or reoxidation of nitrided oxide by, for example, including nitrogen containing species in the deposition process used for LTO 260. For purposes of description, protective layer 260 will continue to be shown in the figures as LTO.

Figure 4:
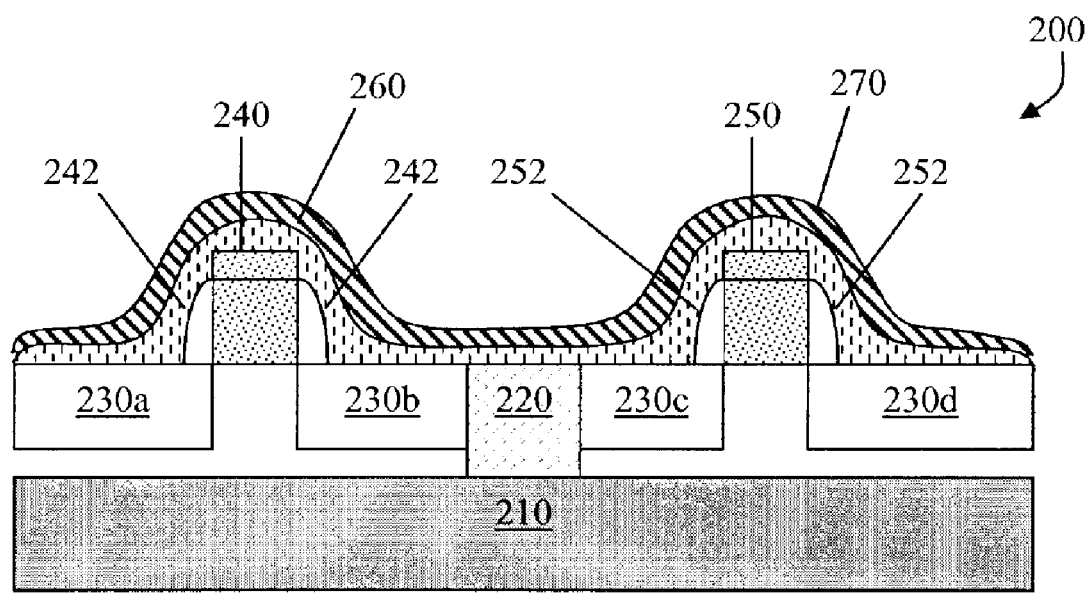
FIG. 4 shows the deposition of a first silicon nitride liner to the device of FIG. 3.

Referring to FIG. 4, a first silicon nitride liner 270 has been deposited over protective layer 260. A suitable silicon nitride liner may be formed by plasma enhanced chemical vapor deposition (PECVD), rapid thermal chemical vapor deposition (RTCVD), or low pressure chemical vapor deposition (LPCVD). Formation by any of these methods is generally done at a temperature between about 400° C. and about 750° C.

As depicted in FIG. 4, first silicon nitride liner 270 is a tensile silicon nitride, although other silicon nitrides are possible, including, for example, compressive silicon nitrides. Depositing tensile nitride liner 270 adjacent NFET 240 induces a tensile stress in the channel, which in turn improves electron mobility and NFET drive current. While first silicon nitride liner 270 is initially deposited onto protective layer 260 adjacent both NFET 240 and PFET 250, manufacture of a device having a dual nitride liner requires removal of first silicon nitride liner 270 from an area adjacent one of the FETs 240, 250.

Figure 5:
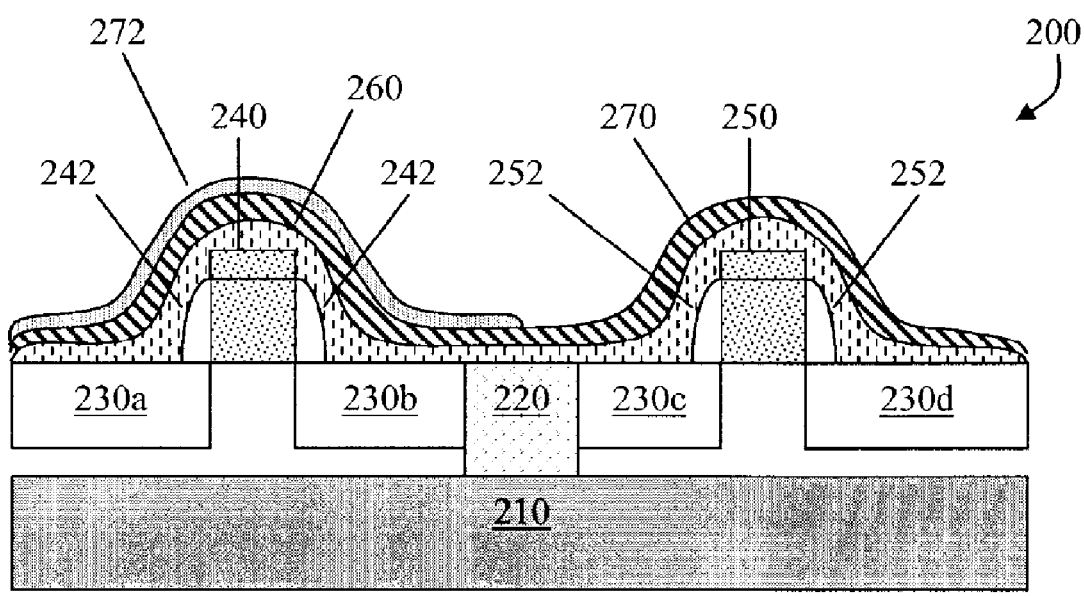
FIG. 5 shows the deposition of an etch-resistant silicon dioxide mask layer over a portion of the first nitride liner.

Referring now to FIG. 5, a portion of first silicon nitride liner 270 has been masked with an etch-resistant silicon dioxide layer 272. Etch-resistant silicon dioxide layer 272 may be deposited by any means known or later developed in the art, including, for example, CVD.

Figure 6:
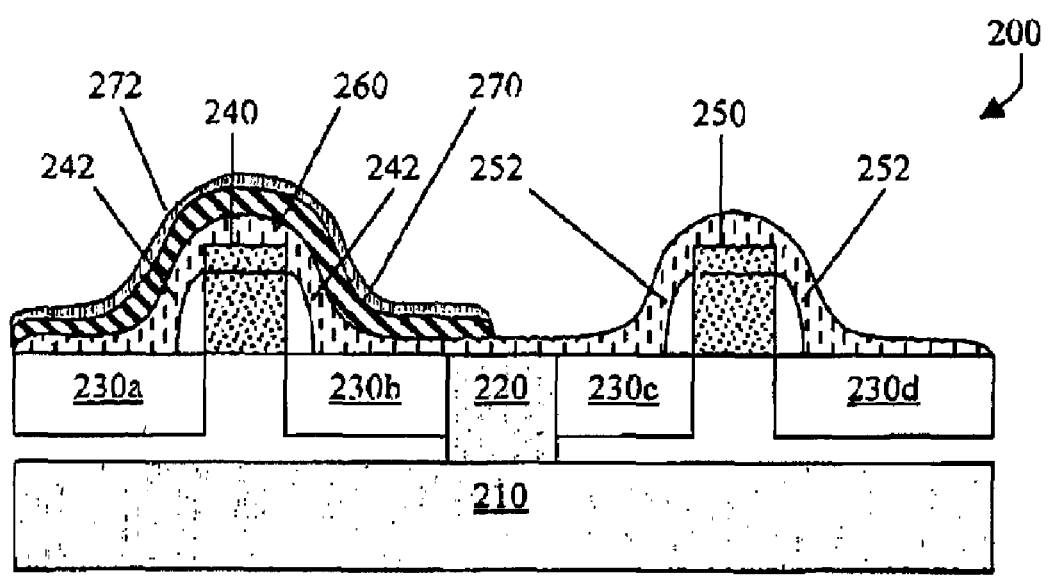
FIG. 6 shows the removal of a portion of the first silicon nitride liner following masking of the NFET and etching of an area near the PFET.

Referring now to FIG. 6, first silicon nitride liner 270 has been etched from an area covering PFET 250. Any etch known or later developed in the art may be utilized, such as an anisotropic reactive ion etch (RIE), provided it is capable of etching first silicon nitride liner 270 and is substantially selective to protective layer 260.

Figure 7:
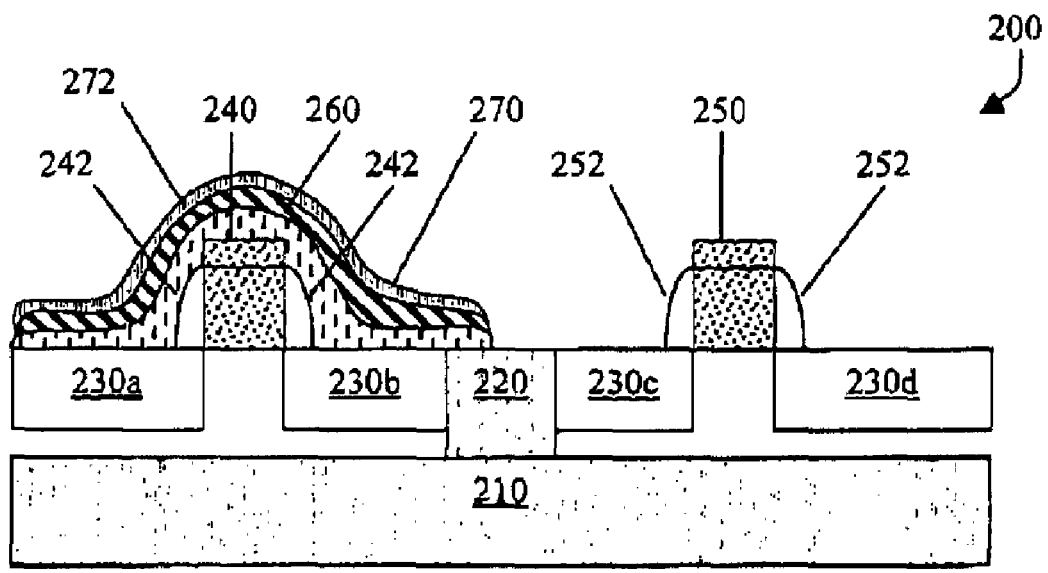
FIG. 7 shows the removal of a portion of the low temperature oxide layer adjacent the PFET.

In FIG. 7, the portion of protective layer 260 exposed by etching first silicon nitride liner 270 has been removed, exposing PFET 250, spacer 252, the portion of silicide layer 230c, 230d adjacent PFET 250, and, optionally, a portion of STI 220. Protective layer 260 may be removed by any means known in the art, including, for example by a very short RIE. Alternatively, protective layer 260 may be removed by a wet etch after deposition of a second silicon nitride liner, described below. Where a silicon oxynitride is used in place of an LTO as protective layer 260, it may be removed by, for example, by a RIE.

Figure 8:
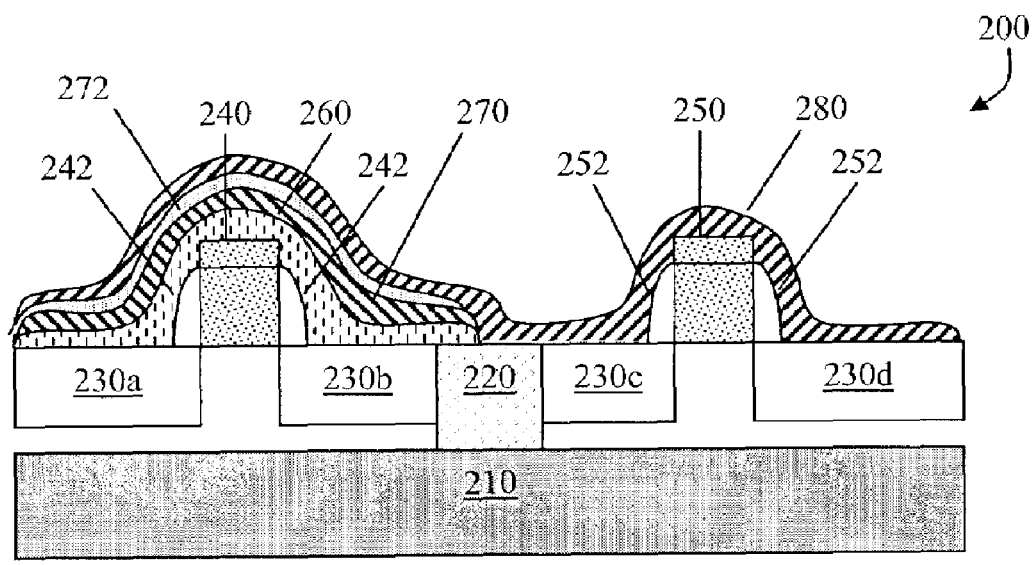
FIG. 8 shows deposition of a second nitride liner to the device of FIG. 7.

Referring to FIG. 8, a second silicon nitride liner 280 is deposited onto device 200. In areas adjacent PFET 250, second silicon nitride liner 280 contacts silicide layer 230c, 230d and PFET 250 directly. Depositing a compressive nitride liner adjacent PFET 250 induces a compressive stress in the channel, improving hole mobility. In areas adjacent NFET 240, second silicon nitride liner 280 contacts first silicon nitride liner 270. In order to form a dual nitride liner, the portion of second silicon nitride liner 280 contacting first silicon nitride liner 270 must be removed.

Figure 9:
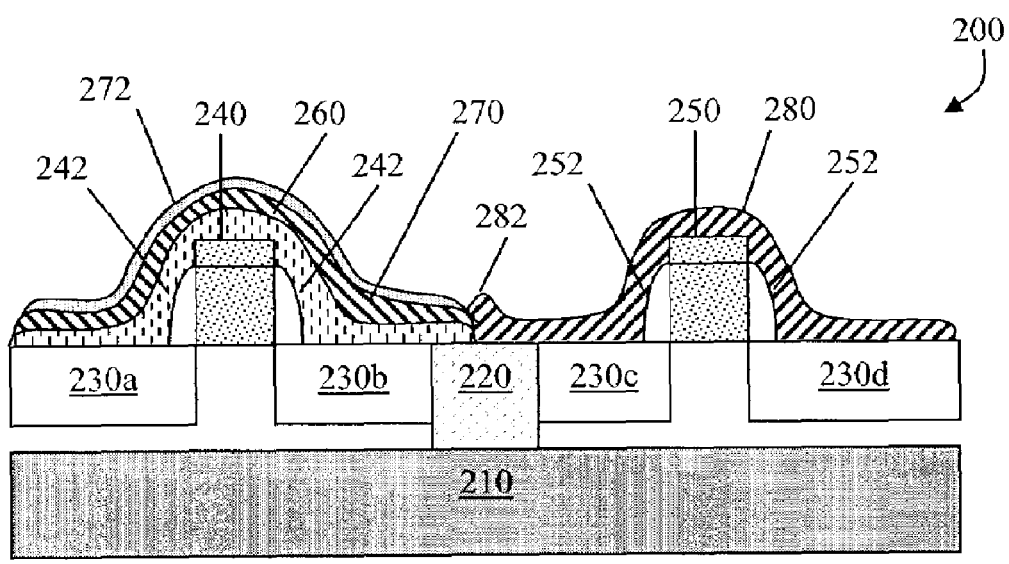
FIG. 9 shows a finished device according to the invention following masking of a portion of the second silicon nitride liner adjacent the PFET and etching of the second silicon nitride liner from an area near the NFET.

In FIG. 9, second silicon nitride liner 280 has been masked in an area adjacent PFET 250 and etched in an area adjacent first silicon nitride liner 270, forming the finished device 200 of the invention. Etch-resistant silicon dioxide layer 272 generally remains over a portion of first silicon nitride liner 270, although it is often thinner than when deposited, due to the repeated etchings described above. Often, an overlap 282 between first silicon nitride liner 270 and second silicon nitride liner 280 remains after etching second silicon nitride liner 280.

Figure 1:
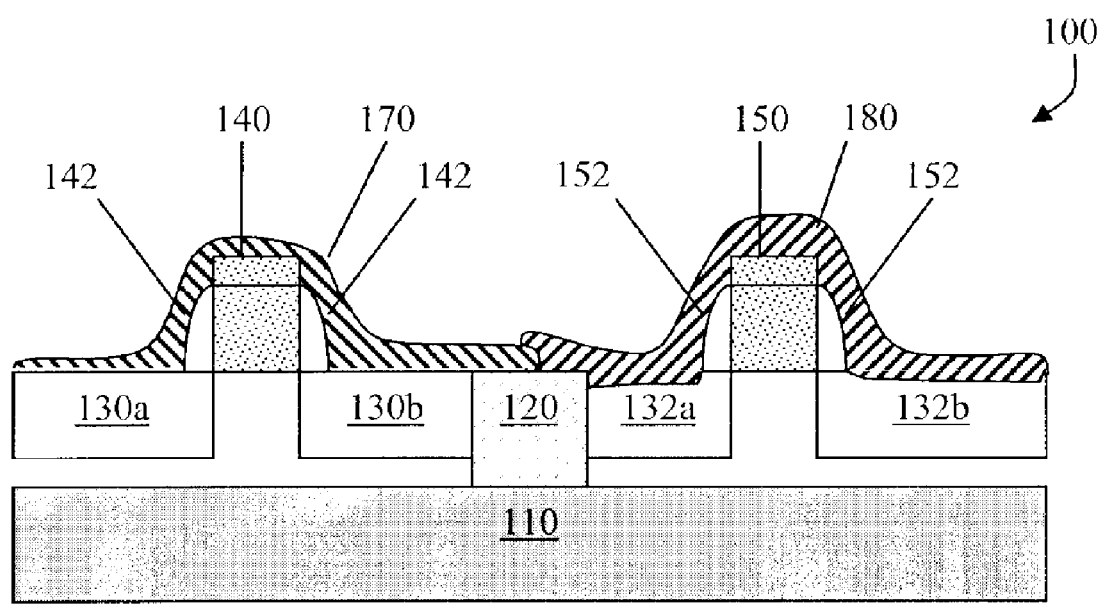
FIG. 1 shows a prior art device including an etched silicide layer.

The differences in device 200 of the present invention and prior art device 100 of FIG. 1 are clear. Silicide layer 230c, 230d adjacent PFET 250 in the device 200 of the present invention has substantially the same thickness (and therefore $R_s$) as silicide layer 230a, 230b adjacent NFET 240. In prior art device 100, on the other hand, etched silicide layer 132a, 132b adjacent PFET 150 is thinner (and therefore has a higher $R_s$) than silicide layer 130a, 130b adjacent NFET 140.

The other clear difference between device 200 of the present invention and prior art device 100 is the presence of protective layer 260 beneath first silicon nitride liner 270. As noted above, the presence of protective layer 260 may result in some stress loss. When protective layer 260 is an LTO, such stress loss is about 20%. While the maintenance of an intact silicide layer 230 makes such a stress loss very worthwhile, stress loss due to a protective layer 260 of an LTO may be compensated for in at least two ways. First, a silicon oxynitride may be used rather than LTO in protective layer 260. Such substitution of silicon oxynitride may be partial or entire. Stress losses associated with use of a silicon oxynitride are generally about 11%.

Second, a thicker first silicon nitride liner 270 may be deposited. Liner thickness are generally between about 50 nm and about 150 nm. A thicker first silicon nitride liner 270 will impart more stress, partially or completely compensating for any stress loss due to the presence of protective layer 260 (LTO or silicon oxynitride), and protective layer 260 allows better etch control, making use of thicker silicon nitride liners possible.

While the present invention has been described as including the first deposition of a tensile silicon nitride liner 270 and the later deposition of a compressive silicon nitride liner 280, it should be appreciated that the order of deposition of these liners may be reversed. That is, it is within the scope of the present invention to form device 200 by the deposition of protective layer 260, deposition of a compressive silicon nitride liner 280, etching of compressive silicon nitride liner from an area around NFET 240, deposition of tensile silicon nitride liner 270, and etching of tensile silicon nitride liner 270 from an area around PFET 250.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for use in the manufacture of a semiconductor device comprising the steps of:
    applying a protective layer to a silicide layer of a device;
    applying a first silicon nitride liner to the protective layer;
    removing a portion of the first silicon nitride liner;
    removing a portion of the protective layer; and
    applying a second silicon nitride liner directly to the silicide layer of the device.

2. The method of claim 1, further comprising the step of removing a portion of the second silicon nitride liner.

3. The method of claim 1, wherein the first silicon nitride liner is formed by at least one of PECVD, RTCVD, and LPCVD.

4. The method of claim 3, wherein the first silicon nitride liner is a tensile silicon nitride liner.

5. The method of claim 1, wherein the second silicon nitride liner is formed by at least one of PECVD, RTCVD, and LPCVD.

6. The method of claim 5, wherein the second silicon nitride liner is a compressive silicon nitride liner.

7. The method of claim 1, wherein the protective layer is at least one of silicon dioxide and a silicon oxynitride.

8. The method of claim 7, wherein at least one of the silicon dioxide and the silicon oxynitride is deposited by chemical vapor deposition.

9. The method of claim 7, wherein at least one of the silicon dioxide and the silicon oxynitride is deposited at a temperature less than about 500° C.

10. The method of claim 7, wherein the silicon oxynitride is formed by at least one of oxide nitridation and reoxidation of nitrided oxide.

11. A method for use in the manufacture of a semiconductor device having an NFET and a PFET, comprising the steps of:
    applying a protective layer to the NFET, PFET, and a silicide layer adjacent at least one of the NFET and the PFET;
    applying a first silicon nitride liner to a portion of the protective layer adjacent the NFET, PFET, and a silicide layer adjacent at least one of the NFET and the PFET;
    removing a portion of the first silicon nitride liner from the protective layer adjacent one of the NFET and the PFET;
    removing a portion of the protective layer from an area adjacent one of the NFET and the PFET; and
    applying a second silicon nitride liner to the first silicon nitride liner and the area from which the protective layer was removed.

12. The method of claim 11, further comprising the step of removing the second silicon nitride liner from a portion of the first silicon nitride liner.

13. The method of claim 11, wherein the first silicon nitride liner is a tensile silicon nitride liner.

14. The method of claim 13, wherein the tensile silicon nitride liner is formed by at least one of PECVD, RTCVD, and LPCVD.

15. The method of claim 13, wherein the first silicon nitride liner is removed from the protective layer adjacent the PFET.

16. The method of claim 11, wherein the second silicon nitride liner is a compressive silicon nitride.

17. The method of claim 16, wherein the compressive silicon nitride is formed by at least one of PECVD, RTCVD, and LPCVD.

18. The method of claim 12, wherein the second silicon nitride liner is removed from a portion of the first silicon nitride liner adjacent the protective layer and the NFET.

19. The method of claim 11, wherein the protective layer is at least one of silicon dioxide and a silicon oxynitride.

20. The method of claim 19, wherein at least one of the silicon dioxide and the silicon oxynitride is deposited by chemical vapor deposition.

21. The method of claim 19, wherein at least one of the silicon dioxide and the silicon oxynitride is deposited at a temperature less than about 500° C.

22. The method of claim 19, wherein the silicon oxynitride is formed by at least one of oxide nitridation and reoxidation of nitrided oxide.

* * * * *